United States Patent [19]

Cauldwell

[11] 3,989,333

[45] Nov. 2, 1976

[54] CABLE TELEVISION TAP CONNECTOR BOX

[75] Inventor: Jack D. Cauldwell, Centerville, Ohio

[73] Assignee: Arvin Industries, Inc., Columbus, Ind.

[22] Filed: Dec. 18, 1975

[21] Appl. No.: 641,957

[52] U.S. Cl. .......... 339/17 C; 339/122 R; 339/177 R; 339/272 A; 174/52 R; 174/60; 317/118; 317/120

[51] Int. Cl.² .......... H05K 1/10; H01R 13/46; H01R 17/20

[58] Field of Search .......... 339/17 R, 17 C, 46, 339/69, 70, 122 R, 122 F, 177, 193 R, 193 A, 219 R, 272 R, 272 A, 272 UC; 174/52 R, 59, 60; 317/99, 118, 120

[56] References Cited

UNITED STATES PATENTS

| | | | |
|---|---|---|---|
| 3,176,230 | 3/1965 | Collins | 317/99 |
| 3,440,329 | 4/1969 | Winston | 174/52 R |
| 3,471,825 | 10/1969 | Huber | 339/177 R X |
| 3,617,811 | 11/1971 | McVoy | 174/59 X |
| 3,629,806 | 12/1971 | Wiechmann | 339/272 R |
| 3,836,943 | 9/1974 | Horak | 339/177 R |
| 3,951,490 | 4/1976 | Devendorf | 339/122 R |

FOREIGN PATENTS OR APPLICATIONS

| | | | |
|---|---|---|---|
| 440,219 | 12/1935 | United Kingdom | 174/59 |

*Primary Examiner*—Joseph H. McGlynn
*Assistant Examiner*—Craig R. Feinberg
*Attorney, Agent, or Firm*—Biebel, French & Nauman

[57] ABSTRACT

A cable television tap connector box for connecting one or more tap cables to the distribution cable includes a first and second cover shell. A circuit board on which is wired an isolation circuit is mounted on the first cover shell. The second cover shell is adapted to be joined to the first cover shell to form the hollow connector box cover which encloses the circuit board. The second cover shell defines input and output openings for the distribution cable. First and second connector means are provided in the connector box for connection with the distribution cable. Each connector means includes a first annular seizure insulator mounted on the circuit board and a second annular seizure insulator mounted on the second cover shell. When the first and second cover shells are joined to form the hollow connector box cover, open ended cable engaging slots in the end of the second annular seizure insulator are closed by the first annular insulator such that a distribution cable conductor positioned in the slots is engaged. A threaded cable engaging screw mounted centrally in the first annular seizure insulator electrically contacts the engaged distribution cable conductor. This tap connector box permits removal and replacement of the circuit board without removing the distribution cable conductors from the connector box.

3 Claims, 6 Drawing Figures

CABLE TELEVISION TAP CONNECTOR BOX

BACKGROUND OF THE INVENTION

The present invention relates to an electrical connector and more particularly to a connector for engaging a coaxial cable of the type used in conventional cable television systems. In such a system, a main or trunk cable is run through a residential area to be serviced. The trunk cable is usually hung from the existing utility poles in the neighborhood. Distribution cables are run from this trunk cable past each home serviced by the television system. A distribution cable is tapped by connecting a tap connector box in series with the distribution cable. The connector box includes isolation electronics for isolating the lines leading from the box to the individual customers' homes.

Typically the tap connector box cover electrically contacts the metallic sheath of the coaxial distribution cable. This cable sheath shields the television signal on the internal, electrically isolated, central conductor from interference as well as providing a ground for the system. The tap connector box which includes at least two openings for receiving the input and output sides of the distribution cable, also includes a provision for electrical contact between the distribution cable sheath and the connector box cover around these openings. The center conductor of the distribution cable will, of course, pass into the interior of the connector box and will be connected to electrical terminals which provide an input and output for the isolation electronics.

Recently, a type of coaxial cable having a copper clad aluminum conductor has come into common use in cable television systems. This wire is easily sheared by a simple cross-screw connector. Modular tap connector boxes, having easily replaceable isolation electronics, have in the past used such cross screw connector arrangements. The circuit board in a modular tap connector is replaceable without disconnecting the distribution cable from the box. The use of standard connectors in modular tap connector boxes has made such boxes undesirable for use with the new aluminum wire. Additionally, intermediate connectors between the cross-screw connectors and the circuit board have heretofore been required in a modular tap connector box. These intermediate connectors were often a source of faulty electrical connection.

As a result, non-modular tap connector boxes with center seizure connectors have been used to eliminate conductor shear and the necessity for intermediate connectors. A center seizure connector is one having an annular post with holes through the post to receive the conductor. A screw extending axially through the post bends the conductor into a U-shape, capturing and electrically contacting it. Since this screw is not immediately adjacent the interior surface of the annular post, the aluminum wire conductor will not be sheared. Secure connections can easily be made with the center seizure connector even when the installer is operating under less than optimum working conditions.

A non-modular connector box using a center seizure mechanism has also been somewhat disadvantageous, however, in that replacement of the circuit board upon which is mounted the isolation electronics is not easily accomplished. The annular post connectors are mounted on the circuit board adjacent a portion of the connector box which defines the access openings for the distribution cable. It has heretofore been necessary to remove the trunk cable connections completely from this type of connector box before replacement of the isolation electronics could be accomplished.

SUMMARY OF THE INVENTION

A modular tap connector box for connecting tap cables to a distribution cable has a first cover shell and a second cover shell adapted to be joined to form a hollow connector box cover which encloses a circuit board. The circuit board is mounted on the first cover shell and the second cover shell defines input and output openings for the distribution cable. Input and output connector means are provided for connecting electrically in series with the distribution cable. Isolation circuit means is mounted on the circuit board. This circuit receives a signal provided to the input connector means by the distribution cable and provides the signal to the output connector means and one or more tap cables while providing electrical isolation. The input and output connector means each comprise a first annular insulator mounted on the circuit board and a second annular insulator mounted on the second cover shell. The second annular insulator defines at least two open ended cable engaging slots and the first annular insulator abuts the second annular insulator such that the slots are substantially closed. A threaded cable engaging screw is mounted centrally in the first annular insulator for electrically contacting an electrical conductor of the distribution cable positioned in the slots of the second annular insulator, whereby the first cover shell may be removed to permit access to and replacement of the enclosed circuit board without moving the distribution cable conductors. Additionally the connector means are so configuration that inspection of the cable is possible after installation to determine if it is properly gripped.

Accordingly, it is an object of the present invention to provide a tap connector box having distribution cable connector means facilitating disassembly of the box; to provide such a box in which is mounted a printed circuit board for isolation electronics and in which the circuit board is readily replaced without disconnection of the distribution cable; to provide such a box in which the cable connector means will not damage the distribution cable; to provide such a box of modular design in which the connector means provide direct electrical connections to the printed circuit board without the need for an intermediate connective arrangement; and, to provide such a box in which the connector means each include annular insulators for seizing the connector and a threaded cable engaging contact mounted axially in the insulators.

Other objects and advantages of the present invention will be apparent from the following description, the accompanying drawings, and the appended claims.

DETAILED DESCRIPTION OF THE DRAWINGS

Figure 1:
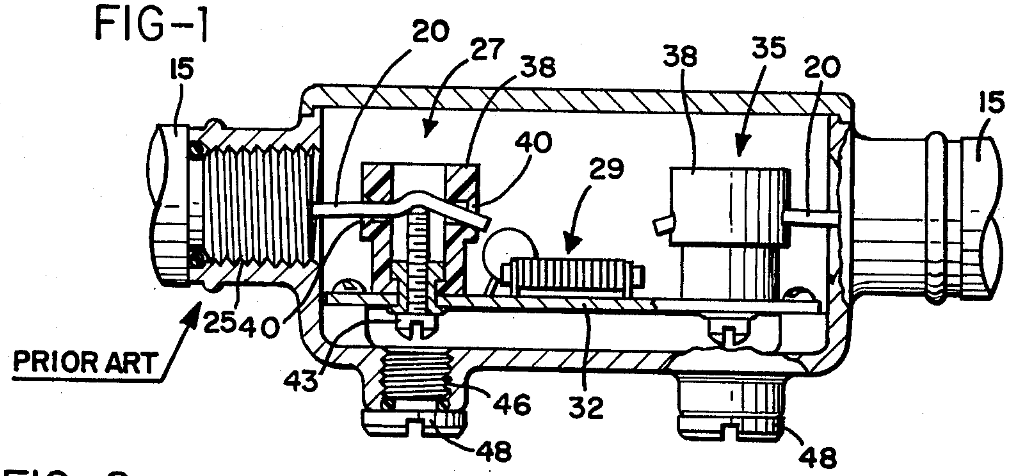
FIG. 1 is a cross-sectional view of a non-modular tap connector box of the prior art.

Referring to FIG. 1, a non-modular tap connector box of the type used previously by the assignee of the present invention in a cable television system is shown in section. When it is desired to tap a distribution cable, the cable is cut and a tap connector box inserted in series with the distribution cable. The distribution cable of coaxial construction includes a metallic sheath 15 and a central conductor 20 which may typically be a copper-coated aluminum wire. The cable supplying the television signal to the tap connector box enters the box through an input opening 25. A connector 27 electrically contacts conductor 20 and supplies the television signal to isolation circuit means 29 mounted on circuit board 32. The isolation circuit 29 includes a directional coupler which receives the input signal and supplies it to one or more tap cables (not shown) through a four-way splitter circuit. The directional coupler and the four-way splitter are of conventional design. This circuit configuration provides for electrical isolation between the distribution cable and the tap cables. The television signal is also supplied to the output distribution cable by connector 35.

Connectors 27 and 35 have in the past been comprised of an annular insulator 38 mounted on circuit board 32. Insulators 38 define at least one pair of openings 40 through which the conductor 20 is placed. Since copper-clad aluminum wire has recently become the standard conductor for coaxial cables and since this wire is susceptible to shear, a threaded electrical contactor 43 of relatively small diameter is provided to move along the central axis of insulator 38. Threaded contactor 43 is not directly adjacent opening 40 and therefore only a gradual bend is made in conductor 20. As a result the possibility of conductor damaging shear force is minimized. An opening 46 and cap 48 are provided to allow access to contactor 43.

The connector arrangement shown in FIG. 1 is advantageous in several respects. Connection to coaxial distribution cables is facilitated and the possibility of damage to the conductors is minimized. This is especially important since these connections are made and adjusted by a worker perched high on a pole carrying the distribution cable. Such a working position does not lend itself to the performance of tasks requiring dexterity.

The connector arrangement shown in FIG. 1 does not, however, facilitate replacement of circuit board 32 and isolation electronics 29. Frequently isolation circuit 29 will malfunction and a worker will have to remove circuit board 32 and replace it with a new unit. As can be seen clearly in FIG. 1, such replacement requires removing conductor wires 20 from connectors 27 and 35 and this can only be accomplished by disconnecting the distribution coaxial cables completely from the connector box. This is a time consuming task and, further, requires that the ends of the distribution cable be held by other means while substitution of the circuit board is accomplished.

The modular tap connector boxes used in the past have facilitated replacement of the isolation electronics but have had other drawbacks. Such tap connector boxes have had the isolation electronics circuit board mounted on a first half of the box and simple cross-screw connectors mounted on a second half of the box adjacent input and output openings defined by the second half of the box. Detachable intermediate connectors have been required to connect the cross-screw connectors to the circuit board. This type of modular connector box is disadvantageous in that such cross-screw connective arrangements are unsuited to aluminum wire. Further, the intermediate connectors are a source of faulty electrical connection.

Figure 2:
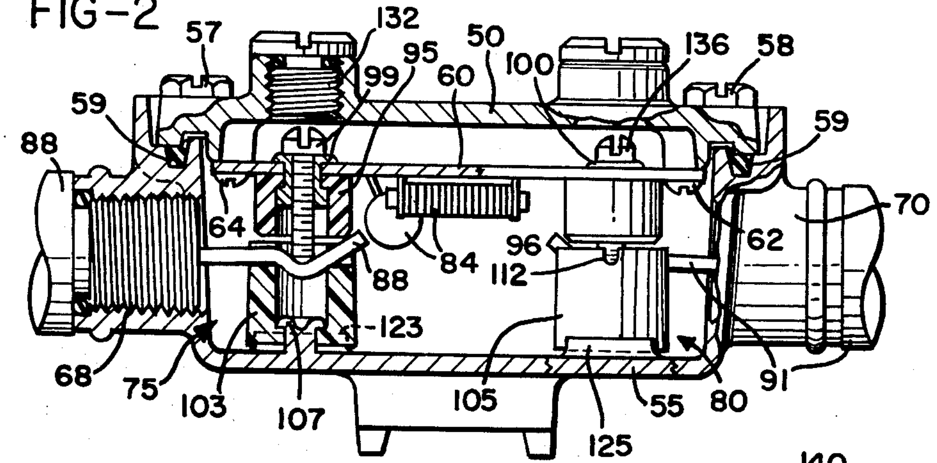
FIG. 2 is a cross-sectional view of the tap connector box of the present invention.

Referring now to FIG. 2, there is shown a connector box of the present invention with portions broken away and in section. This modular tap connector box includes a first cover shell 50 and a second cover shell 55 which are adapted to be joined by bolts 57 and 58 to form a cover. Gasket 59 is provided to insure that the cover is weatherproof. A circuit board means 60 is enclosed within the cover and mounted on the first cover shell 50 by screws 62 and 64. Second cover shell 55 defines an input conductor admitting opening 68 for receiving a distribution coaxial cable and a similar output opening 70 for admitting the output distribution cable. An input connector means 75 and an output connector means 80 are connected electrically in series with the distribution cable.

Isolation circuit means, including components 84, is mounted on circuit board means 60. The isolation circuit is of conventional design and receives a signal supplied to input connector means 75 by the input distribution cable 88 and provides the signal to output connector means 80 which is connected to output distribution cable 91. The isolation circuit means additionally supplies the input signal to one or more tap cables (not shown) which lead to individual homes. The input and output connector means comprise first annular seizure insulators 95 and 96, respectively, which are held on circuit board 60 by mounts 99 and 100. Second annular seizure insulators 103 and 105 are mounted on second cover shell 55 by rivets 107.

Figure 3:
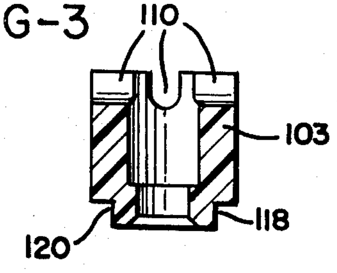
FIG. 3 is a cross-sectional view of an annular insulator having cable engaging slots.
Figure 4:
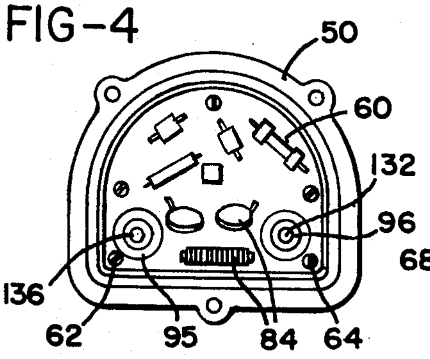
FIG. 4 is an elevational view of the interior of half of the tap connector box of the present invention.
Figure 5:
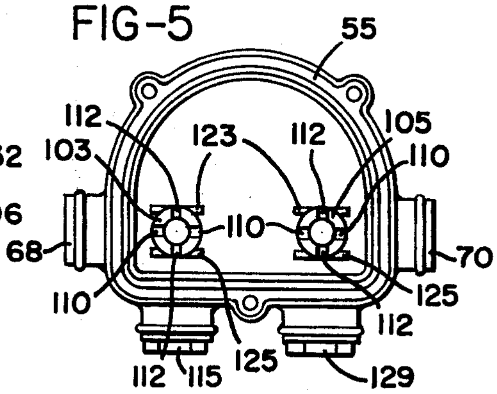
FIG. 5 is an elevational view of the interior of the remaining half of the tap connector box of the present invention.

The shapes of the first and second insulating annulii 95, 96, 103, and 105 are shown more clearly by reference of FIGS. 3, 4, and 5. FIG. 3 shows a cross-section of insulator 103. A number of open ended cable engaging slots 110 are provided along the upper edge of insulator 103. As seen in FIG. 5, one pair of slots 110 is provided for engaging the distribution cable attached through input opening 68 and a second set of cable engaging slots 112 is provided for engaging the distribution cable if opening 115 should be used.

As seen in FIGS. 3 and 5, the second annular seizure insulators have two step-down regions 118 and 120 which engage ridges 123 and 125 to prevent rotation of the second annular insulators 103 and 105 and thus keep slots 110 and 112 properly aligned with the conductor admitting openings 68, 70, 115, and 129.

In FIGS. 2 and 4 may be seen threaded cable engaging screws 132 and 136 which are threaded into mounts 99 and 100. Screws 132 and 136 electrically contact the electrical conductors of the distribution cable positioned in slots 110 and 112 and thus connect these cables to isolation electronics 84 without the need for intermediate connectors as in prior art modular connector boxes. This connection arrangement also causes the aluminum conductor to be bent into a gentle U-shape and thus eliminates the possibility of damage to the cable.

When it is desired to replace the isolation circuit mounted on circuit board 60, the first cover shell 50 may be disassembled from the second cover shell 55 without disattachment of the distribution cables 88 and 91 from the second cover shell 55. The circuit board 60 along with associated isolation electronics, first annular seizure insulators 95 and 96, and electrical contactor means 132 and 136, are then replaced.

Figure 6:
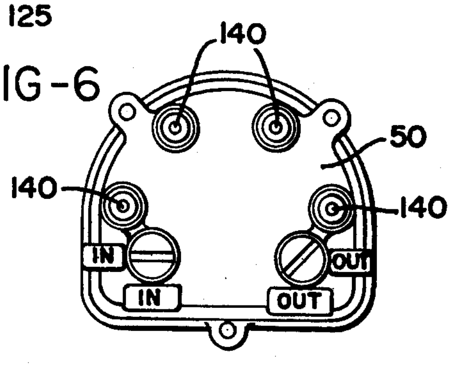
FIG. 6 is an elevational view of the other side of the portion of the tap connector box shown in FIG. 4.

FIG. 6 shows the other side of the first cover shell 50 shown in FIG. 4. Four standard coaxial cable connectors 140 are provided on the shell for connection to the tap cables leading to the homes serviced by the cable television system. Connectors 140 are each connected to the isolation electronics on the circuit board means 60 mounted inside shell 50.

While the form of apparatus herein described constitutes a preferred embodiment of the invention, it is to be understood that the invention is not limited to this precise form of apparatus, and that changes may be made therein without departing from the scope of the invention.

I claim:

1. A connector for seizing and electrically contacting a conductor comprising:

a first cover shell, a second cover shell secured to said first cover shell and defining a conductor admitting opening, a first insulating annulus mounted on said first cover shell, a second insulating annulus mounted on said second cover shell, open ended slot means defined by said second insulating annulus for positioning an electrical conductor, said second insulating annulus being positioned adjacent said first insulating annulus such that a conductor in said open ended slot means is held therein by said first insulating annulus, and electrical contact means mounted centrally in said first insulating annulus to be movable along the central axis of said first insulating annulus to contact electrically said conductor.

2. Means for engaging a coaxial cable, said cable having a central conductor and an outer metallic sheath, comprising:

a first cover shell, a second cover shell defining a cable accepting opening, means for joining said first and second shells to form a cover, sheath engaging means around said cable accepting opening for engaging the outer metallic sheath of a coaxial cable and making electrical contact therewith, a first annular insulator mounted on said first cover shell inside said cover, a second annular insulator mounted on said second cover shell inside said cover and defining a plurality of open ended slots for engaging the central conductor of a coaxial cable, said second annular insulator being positioned such that said first annular insulator will abut the open ends of said slots to hold a central conductor in said slots, and electrical contact means movably mounted within the central opening of said first annular insulator for contacting a central conductor held in said slots.

3. A modular tap connector box of the type used to connect one or more tap cables to a distribution cable in a cable television system comprising:

a first cover shell, circuit board means mounted on said first cover shell, a second cover shell adapted to be joined to said first cover shell to form a hollow connector box cover enclosing said circuit board means and defining input and output openings for said distribution cable, input connector means and output connector means for connecting electrically in series with said distribution cable, isolation circuit means, mounted on said circuit board means and electrically connected to said connector means, for receiving a signal applied to said input connector means by said distribution cable and for providing said signal to said output connector means and to one or more tap cables, said connector means each comprising:

first annular seizure insulator mounted on said circuit board means, second annular seizure insulator mounted on said second cover shell, said second annular seizure insulator defining at least two open ended cable engaging slots and said first annular seizure insulator abutting said second annular seizure insulator such that said open ended cable engaging slots are substantially closed, and a threaded cable engaging screw mounted centrally in said first annular seizure insulator for electrically contacting an electrical conductor of said distribution cable positioned in said slots in said second annular seizure insulator, whereby said first cover shell may be removed to permit access to and replacement of said circuit board means without moving said distribution cable conductors, said distribution cable is not damaged by said input and output connector means, and said connector means provide direct connections to said isolation circuit means.

* * * * *